United States Patent [19]
Sasaki et al.

[11] Patent Number: 5,128,973
[45] Date of Patent: Jul. 7, 1992

[54] CIRCUIT SYSTEM FOR PREVENTING MEASURING DEVICE FROM BEING ERRONEOUSLY OPERATED

[75] Inventors: Masahiro Sasaki; Hideyuki Kamiyama, both of Kanagawa; Yoji Oki, Fuchu, all of Japan

[73] Assignee: Stanley Electric Co., Ltd., Tokyo, Japan

[21] Appl. No.: 601,512

[22] Filed: Oct. 23, 1990

[30] Foreign Application Priority Data

Oct. 27, 1989 [JP] Japan ..................... 1-280060

[51] Int. Cl.⁵ ............... H03K 5/135; H03K 9/04; H03K 3/013; H03K 21/40
[52] U.S. Cl. .................... 377/28; 307/290; 307/517; 307/522; 377/20
[58] Field of Search .......... 377/28, 20; 307/290, 307/517, 522

[56] References Cited

U.S. PATENT DOCUMENTS

| | | | |
|---|---|---|---|
| 3,553,488 | 1/1971 | Darrow | 307/290 |
| 3,780,727 | 12/1973 | King | 307/517 |
| 4,045,687 | 8/1977 | Maringer | 307/290 |
| 4,349,754 | 9/1982 | Bull | 307/517 |
| 4,694,256 | 9/1987 | Kawamura | 307/517 |
| 4,887,071 | 12/1989 | Virdee | 307/517 |

Primary Examiner—John S. Heyman
Attorney, Agent, or Firm—Louis Weinstein

[57] ABSTRACT

A circuit system for preventing a measuring device such as an engine speed measuring device or the like from being erroneously operated includes as essential components a filter circuit, a Schmitt trigger circuit, an oscillating circuit, a counting circuit, a pulse monitoring circuit and an adding circuit. A combination of the filter circuit and the Schmitt trigger circuit serve to properly shape a wave form of each of a series of pulse-shaped sensor detection signals. The oscillating circuit generates a series of pulses each having a reference frequency. The pulse monitoring circuit monitors a waveform shaping output pulse by counting the number of a series of output pulses each having a reference frequency for a predetermined period of time with the edge of the wave-form shaping output pulse as a trigger. In addition, the pulse monitoring circuit serves to discriminate whether a bound is caused in the wave-form shaping output signal or not and then deliver a processing signal to a processing circuit at the next stage. The circuit system has a diverging point which is located between the Schmitt circuit and the counting circuit so that a series of pulse-shaped sensor detecting signals are transmitted to the pulse monitoring circuit via the diverging point.

8 Claims, 3 Drawing Sheets

S SENSOR
Z ROTARY MEMBER
X ROTATIONAL SHAFT

CIRCUIT SYSTEM FOR PREVENTING MEASURING DEVICE FROM BEING ERRONEOUSLY OPERATED

BACKGROUND OF THE INVENTION

1. Field of the Invention

The present invention relates generally to a circuit system for preventing a measuring device from being erroneously operated. More particularly, the present invention relates to a circuit system for preventing a measuring device such as an engine speed measuring device or the like from being erroneously operated due to a bound which is caused in a wave form representative of a sensor detection output when the present engine speed or the like is measured by the measuring device.

2. Description of the Related Art

For example, in a case where the rotational speed of a rotary member Z is measured, sensors (photosensors, magnetic sensors or the like) S constituting a measuring device are arranged in the vicinity of the rotary member Z as well as a rotational shaft X of the rotary member Z in a spaced relationship to count the number of a series of detection signals, as shown in FIG. 3. In addition, the measuring device is provided with a filter circuit 1 including resistors and a capacitor and a Schmitt trigger circuit 2 at its input stage so as to properly shape the wave form of each of the detection signals from the sensors S and moreover prevent an erroneous operation from being performed attributable to a bound component in the detection signal, as shown in FIG. 4.

With the measuring device as constructed in the above-described manner, however, it is necessary that a value of resistance of the respective resistors, a value of capacitance of the capacitor in the filter circuit 1 and characteristics of the Schmitt trigger circuit 2 are individually correctly regulated depending on measuring conditions (kind and characteristics of the sensors, minimum/maximum frequency of a pulse to be measured and other conditions). Further, even though optimum conditions are once settled for the measuring device, there is still a possibility that the bound can not completely be removed and thereby the bound component is unavoidably counted when properties of the sensors used for the measuring device are undesirably deteriorated.

SUMMARY OF THE INVENTION

The present invention has been made with the foregoing background in mind.

Therefore, an object of the present invention is to provide a circuit system for preventing a measuring device from being erroneously operated wherein an erroneous operation due to inclusion of a bound component in each of a series of pulse-shaped sensor detection signals can be prevented reliably.

To accomplish the above object, the present invention provides a circuit system for preventing a measuring device from being erroneously operated, wherein the circuit system includes as essential components a filter circuit and a Schmitt circuit both of which serve to properly shape a wave form of each of a series of pulse-shaped sensor detection signals, an oscillating circuit for generating a series of output pulses each having a reference frequency, a counting circuit for counting the number of the output pulses each having a reference frequency with the edge of a wave-form shaping output pulse as a trigger, a pulse monitoring circuit for monitoring the wave-form shaping output pulse by counting the number of the output pulses each having a reference frequency for a predetermined period of time with the edge of the wave-form shaping output signal as a trigger, the pulse monitoring circuit additionally serving to discriminate whether a bound is caused in the wave-form shaping output or not and then delivering a processing signal to an adding circuit based on the results derived from the foregoing discriminating operation performed by the pulse monitoring circuit, and the adding circuit being adapted to receive an output from the counting circuit to perform a holding/adding operation in response to a signal from the pulse monitoring circuit.

The circuit system of the present invention has a diverging point which is located between the Schmitt trigger circuit and the counting circuit so that the pulse-shaped sensor detection signals are transmitted to the pulse monitoring circuit via the diverging point.

The pulse-shaped sensor detection signals are transmitted to the adding circuit via the filter circuit, the Schmitt trigger circuit, the diverging point and the counting circuit so that the results derived from an adding operation in the adding circuit are delivered to a processing circuit at the next stage.

The output pulses generated in the oscillating circuit are transmitted to the adding circuit via the pulse monitoring circuit, the diverging point and the counting circuit so that the results derived from an adding operation in the adding circuit are delivered to the processing circuit at the next stage.

In addition, the output pulses are transmitted to the adding circuit via the counting circuit so that the results derived from an adding operation in the adding circuit are delivered to the processing circuit at the next stage.

Other objects, features and advantages of the present invention will become apparent upon reading the following description which has been made in conjunction of the accompanying drawings.

BRIEF DESCRIPTION OF THE DRAWINGS

The present invention is illustrated in the following drawings in which.

DESCRIPTION OF THE PREFERRED EMBODIMENT

Now, the present invention will be described in detail hereinafter with reference to the accompanying drawings which illustrates a preferred embodiment of the present invention.

Figure 1:
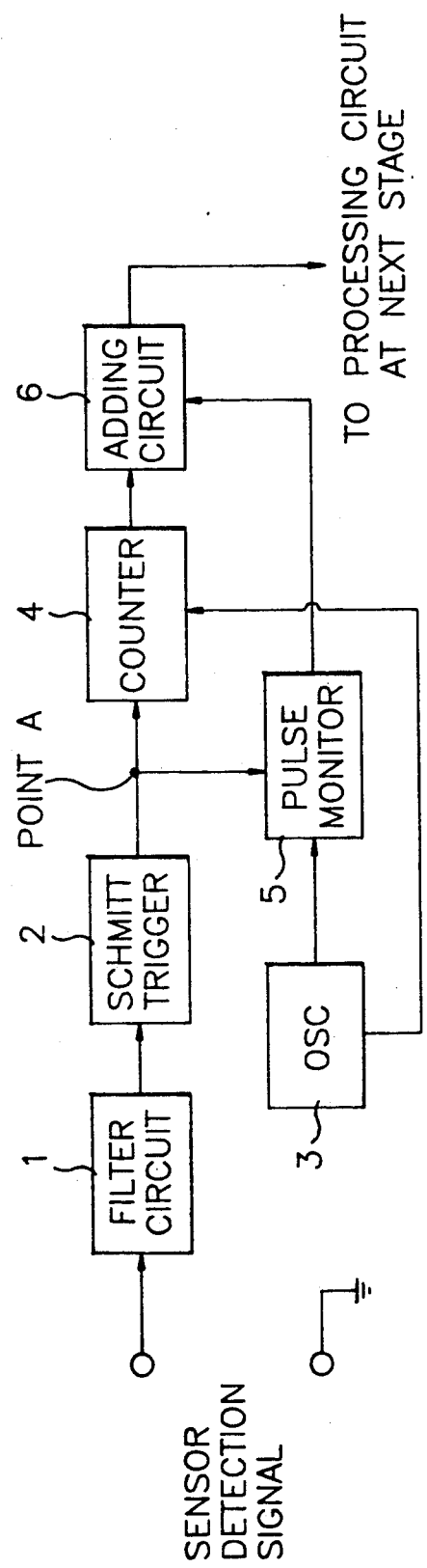
FIG. 1 is a block diagram which schematically illustrates a circuit system for preventing a measuring device such as an engine speed measuring device or the like from being erroneously operated in accordance with an embodiment of the present invention.

FIG. 1 is a block diagram which schematically illustrates a circuit system for preventing a measuring device such as engine speed measuring device or the like from being erroneously operated in accordance with the embodiment of the present invention. In the drawing, reference numeral 1 designates a filter circuit (e.g., a low-pass filter composed of resistors and a capacitor) and reference numeral 2 designates a Schmitt trigger circuit. A wave-form shaping operation is performed by the filter circuit 1 and the Schmitt trigger circuit 2 in response to inputting of a pulse-shaped sensor detection signal. In addition, reference numeral 3 designates an oscillating circuit for generating a series of output pulses each having a reference frequency, reference numeral 4 designates a counting circuit for counting the number of a series of output pulses outputted from the oscillating circuit 3 with the edge of a wave-form shaping output pulse from the Schmitt circuit 2 as a trigger appearing at point A, and reference numeral 5 designates a pulse monitoring circuit for determining, based on the results derived from counting of the number of a series of output pulses from the oscillating circuit 3 for a predetermined period of time $T_1$ with the edge of an output pulse from the Schmitt circuit 2 as a trigger, whether or not an input has a bound included therein. The pulse monitoring circuit 5 outputs a processing signal to a processing circuit at the next stage via an adding circuit 6 to be described later, depending on the results derived from the foregoing discriminating operation performed by the pulse monitoring circuit 5. Reference numeral 6 designates an adding circuit adapted to receive an output from the counting circuit 4 thereby to perform a holding/adding operation in response to the output in the form of a signal from the pulse monitoring circuit 5 and then deliver the results derived from the holding/adding operation in the adding circuit 6 to the processing circuit at the next stage.

It should be noted that the time $T_1$ is set in consideration of the number of rotations of an object to be measured and switching characteristics of each sensor. To arbitrarily change the setting operation for the time $T_1$, a memory, a register or the like component may be used for a setting circuit which is used for setting the time $T_1$.

Next, operation of the circuit system of the present invention as constructed in the above-described manner will be described below.

Figure 2:
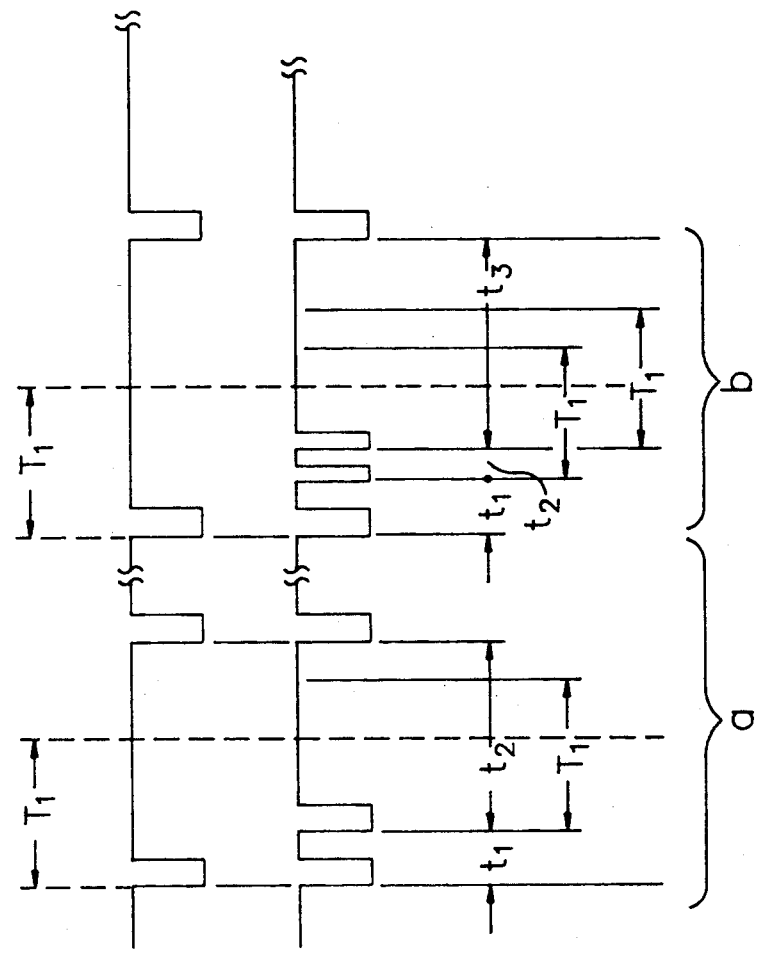
FIG. 2 is a diagram which illustrates the wave form of a wave form shaping output pulse to explain operations to be performed by the circuit system in FIG. 1.
Figure 3:
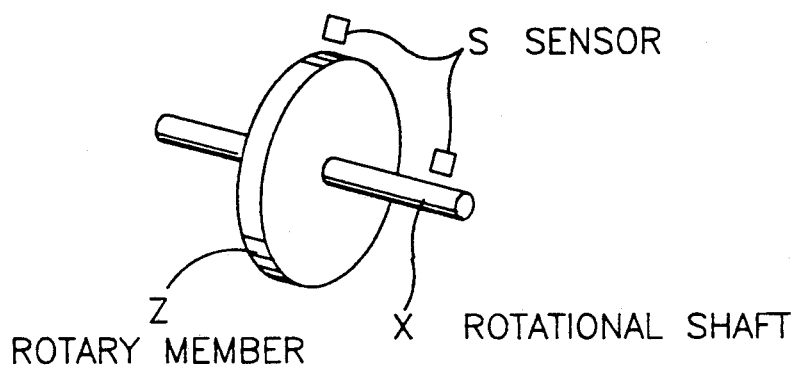
FIG. 3 is a perspective view which schematically illustrates by way of example a conventional rotational speed detecting circuit system.
Figure 4:
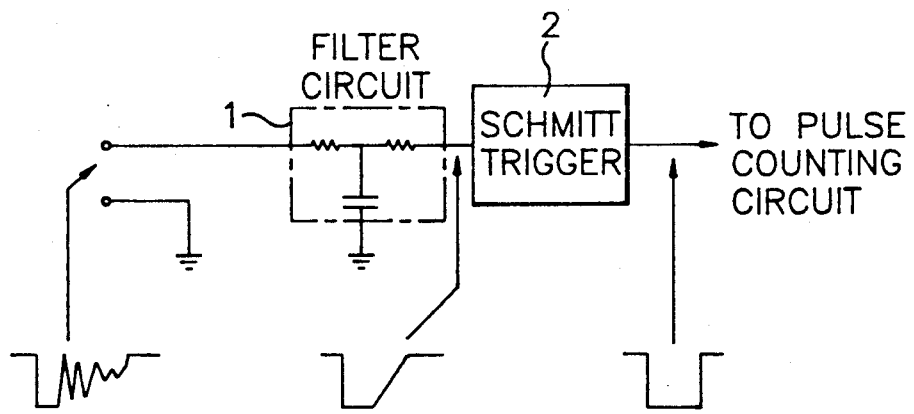
FIG. 4 is a circuit diagram which illustrates by way of example the structure of a wave-form shaping circuit in the conventional circuit system in FIG. 3 adapted to output a sensor detection signal.

When the circuit system receives an input, the filter circuit 1 and the Schmitt circuit 2 are activated to properly shape a wave form of the input as shown in FIG. 2. Then, a counting operation for counting the number of a series of output pulses each having a reference frequency (pulses outputted from the oscillating circuit 3) is performed by the counting circuit 4 and the pulse monitoring circuit 5. In a case where the circuit system does not generate any wave-form shaping output pulse within the predetermined period of time $T_1$ (hereinafter referred to as the a case), the circuit system outputs a signal which instructs that an output from the counting circuit 4 should be delivered to the processing circuit at the next stage as it is left unchanged.

To the contrary, in a case where the circuit system practically generates a wave-form shaping output pulse within the predetermined period of time $T_1$ (hereinafter referred to as the b case), an output from the counting circuit 4 is once held in the adding circuit 6 in response to a signal outputted from the pulse monitoring circuit 5. At the same time, the pulse monitoring circuit 5 monitors a series of pulses within a subsequent period of time $T_1$. Since the a case represents that the circuit system does not generate any wave-form shaping output pulse within the predetermined period of time $T_1$, the counted value held in the adding circuit 6 for a period of times $t_1$ and $t_2$ is added and the results derived from the foregoing adding operation performed by the adding circuit 6 are outputted to the processing circuit at the next stage.

Since the b case represents that the circuit system generates wave-form shaping output pulses twice within time period $T_1$, an output from the counting circuit 4 within a period of time $t_2$ is once held in the adding circuit 6. At the same time, the pulse monitoring circuit 5 monitors a series of output pulses within a subsequent period of time $T_1$. In a case where the circuit system fails to generate a wave-form shaping pulse at the third time, the counted value held in the adding circuit for a period of times $t_1$, $t_2$ and $t_3$ is added and the results derived from the foregoing adding operation performed by the adding circuit 6 are outputted to the processing circuit at the next stage.

As is apparent from the above description, according to the present invention, the circuit system monitors a waveform shaping output pulse within a predetermined period of time in consideration of the number of rotations of an object to be measured and switching characteristics of each sensor. In a case where an input has a bound component included therein, the circuit system performs a holding/adding operation based on the value derived from a counting operation for counting the number of a series of output pulses each having a reference frequency so as to allow a specified value to be reached. Therefore, the circuit system can reliably prevent a measuring device from being erroneously operated due to inclusion of the bound component. It should be added that the filter circuit and the Schmitt circuit are not required to have strict characteristics, resulting in a regulating operation being performed easily.

While the present invention has been described above with respect to a single preferred embodiment, it should of course be understood that the present invention should not be limited only to this but various changes or modifications may be made without departure from the scope of the claim as defined by the appended claims.

What is claimed is:

1. A circuit system for preventing a measuring device from being erroneously operated, wherein said circuit comprises:
    a waveform shaping circuit for generated output pulses properly shaped into a predetermined wave shape responsive to sensor detection signals derived from a sensor for sensing the occurrence of signals normally spaced apart by a time interval T;
    an oscillating circuit for generating a series of output pulses at a predetermined reference frequency;
    a counting circuit for counting oscillating circuit output pulses responsive to an output pulse from said waveform shaping circuit employed as a trigger input to said counting circuit;
    a pulse monitoring circuit for monitoring the time interval between output pulses from said waveform shaping circuit by counting said oscillator circuit output pulses responsive to each output pulse from said waveform shaping circuit employed as a trigger input to said pulse monitoring circuit;
    an adding circuit coupled to said counting circuit;

said pulse monitoring circuit controlling said adding circuit to accumulate counts successively developed in said counting circuit when the count of oscillator pulses accumulated by said pulse monitoring circuit is less than a predetermined count C and for resetting the adding circuit in preparation to receive the next count from said counting circuit, wherein said count C represents the number of oscillator output pulses generated during time interval T.

2. The circuit system of claim 1 wherein said waveform shaping circuit comprises a filter circuit and a Schmitt trigger circuit.

3. The circuit system according to claim 2, wherein the circuit system has a diverging point which is located between the Schmitt trigger circuit and the counting circuit so that said wave-shaped sensor detection signals are transmitted to the pulse monitoring circuit via said diverging point.

4. The circuit system according to claim 3, wherein said output pulses generated by said oscillating circuit are transmitted to the adding circuit under control of the pulse monitoring circuit, the diverging point and the counting circuit enabling the results derived from an adding operation in the adding circuit are delivered to a processing circuit.

5. The circuit system according to claim 2 wherein said pulse monitoring circuit comprises means for counting the number of said output pulses each having a reference frequency for a predetermined period of time upon the occurrence of each wave form shaping output pulse generated by said filter circuit and said Schmitt trigger circuit.

6. The circuit system of claim 5 wherein said pulse monitoring circuit includes means for adjusting the counting period of the pulse monitoring circuit counting means.

7. The circuit system of claim 5 wherein the output pulses from said oscillator circuit are simultaneously applied to and counted by said counting circuit and said pulse monitoring circuit counting means; and the output of said waveform shaping circuit is simultaneously applied to said counting circuit and the counting means of said pulse monitoring circuit for triggering.

8. The circuit system of claim 5 wherein said pulse monitoring circuit controls said adder circuit to contain the count in the counting circuit when the pulse monitoring circuit accumulates a count greater than C upon receipt of the next trigger input to the pulse monitoring circuit.

* * * * *